United States Patent
Kondo et al.

(10) Patent No.: US 7,605,502 B2
(45) Date of Patent: Oct. 20, 2009

(54) AUTOMOTIVE ALTERNATOR WITH RECTIFIER HAVING HIGH-STRENGTH HEAT SINKS

(75) Inventors: Koji Kondo, Kiyosu (JP); Masatoshi Koumura, Okazaki (JP)

(73) Assignee: Denso Corporation, Kariya (JP)

( * ) Notice: Subject to any disclaimer, the term of this patent is extended or adjusted under 35 U.S.C. 154(b) by 509 days.

(21) Appl. No.: 11/509,673

(22) Filed: Aug. 25, 2006

(65) Prior Publication Data

US 2007/0046114 A1 Mar. 1, 2007

(30) Foreign Application Priority Data

Aug. 29, 2005 (JP) ............... 2005-247677

(51) Int. Cl.
*H02K 11/04* (2006.01)
(52) U.S. Cl. ..................... 310/68 D; 310/58
(58) Field of Classification Search ............. 310/58, 310/62, 68 D, 71, 89
See application file for complete search history.

(56) References Cited

U.S. PATENT DOCUMENTS

| 6,184,602 | B1 | 2/2001 | Ooiwa et al. | |
|---|---|---|---|---|
| 6,307,289 | B1 | 10/2001 | Skala | |
| 6,707,691 | B2 | 3/2004 | Bradfield | |
| 6,809,443 | B2 | 10/2004 | Nakamura et al. | |
| 6,888,275 | B2 * | 5/2005 | Nakano | .............. 310/89 |
| 7,067,947 | B2 * | 6/2006 | Ihata et al. | ................... 310/62 |
| 7,242,120 | B2 * | 7/2007 | Ikuta et al. | ................... 310/62 |
| 7,352,091 | B2 * | 4/2008 | Bradfield | ................ 310/68 D |
| 2003/0178899 | A1 | 9/2003 | Aeschlimann et al. | |
| 2004/0051409 | A1 | 3/2004 | Nakamura et al. | |
| 2004/0174081 | A1 | 9/2004 | Einheuser et al. | |
| 2004/0256924 | A1 | 12/2004 | Ueda et al. | |

FOREIGN PATENT DOCUMENTS

| DE | 198 28 518 A1 | 12/1999 |
|---|---|---|
| EP | 1 460 750 A1 | 9/2004 |
| FR | 1 330 419 A | 6/1963 |
| GB | 2 334 815 A | 9/1999 |
| JP | A-59-198862 | 11/1984 |
| JP | A-10-56760 | 2/1998 |
| JP | A-10-056762 | 2/1998 |
| JP | A 2004-112860 | 4/2004 |
| JP | A 2004-282937 | 10/2004 |

* cited by examiner

*Primary Examiner*—Thanh-Tam T Le
(74) *Attorney, Agent, or Firm*—Oliff & Berridge, PLC

(57) ABSTRACT

A rectifier of an automotive alternator includes a heat sink that has fitting holes, in each of which one rectifying element is fitted, and a major surface on which the fitting holes open. The heat sink also has substantially annular ribs, each of which is formed on the major surface around a corresponding one of the fitting holes. Each of the ribs has a first portion, which lies in an area on the major surface where a minimum distance between an inner edge of the heat sink defining the corresponding fitting hole and an outer edge of the heat sink defining an outline of the heat sink is smaller, and a second portion that lies in an area on the major surface where a minimum distance between the inner and outer edges is larger. The first portion has a greater protruding height from the major surface than the second portion.

20 Claims, 10 Drawing Sheets

AUTOMOTIVE ALTERNATOR WITH RECTIFIER HAVING HIGH-STRENGTH HEAT SINKS

CROSS-REFERENCE TO RELATED APPLICATION

This application is based on and claims priority from Japanese Patent Application No. 2005-247677, filed on Aug. 29, 2005, the content of which is hereby incorporated by reference into this application.

BACKGROUND OF THE INVENTION

1. Technical Field of the Invention

The present invention relates generally to automotive alternators and rectifiers. More particularly, the invention relates to an automotive alternator which includes a rectifier having high-strength heat sinks.

2. Description of the Related Art

In recent years, engine rooms in vehicles have been reduced to meet the requirements of adopting a slant-nose design to reduce the running resistance and securing more sufficient space in the vehicle compartments. Meanwhile, the number of engine accessories to be installed in an engine room has increased. Consequently, automotive alternators are now subjected to higher ambient temperatures in engine rooms and required to be more compact.

On the other hand, due to an increase in electric load for improving comfort and the security of the vehicle, automotive alternators are now required to have a larger power capacity and thus come to generate a greater amount of heat.

In particular, among the components of an automotive alternator, a rectifier that includes a plurality of rectifying elements (e.g., diodes) generally experiences a great rise in temperature during operation of the automotive alternator. Accordingly, it is required to secure sufficient cooling of the rectifier without increasing the size and cost of the automotive alternator.

U.S. Pat. No. 6,809,443 discloses a rectifying device incorporated in an automotive alternator. Specifically, in the rectifying device, rectifying elements are press-fitted in receiving holes formed in a pair of cooling fins (i.e., heat sinks), thereby eliminating conventional soldering operation; the cooling fins each have a plurality of ribs extending radially with respect to a rotary shaft of the automotive alternator, thereby improving the cooling performance of the cooling fins without increasing the size of the automotive alternator.

US Patent Application Publication No. 2004/0256924 discloses a rectifier incorporated in an automotive alternator. Specifically, in the rectifier, rectifying elements are press-fitted in press-in holes formed in a pair of radiating fins (i.e., heat sinks); the radiating fins each have a plurality of radial sub-fins that extends radially with respect to a rotary shaft of the automotive alternator; the radiating fins each further have a plurality of arc-like sub-fins, each of which is formed in the vicinity of one of the press-in holes, thereby enhancing the strength thereof; the radiating fins each have a large thickness in the vicinities of the press-in holes, so as to prevent cracks from occurring during the operation of press-fitting the rectifying elements into the press-in holes.

However, in the above prior art rectifying device and rectifier, since the cooling or radiating fins have formed therein the receiving or press-in holes and the ribs or sub-fins, they have a very complicated shape. Thus, thickness-reducing portions and stress-concentrating portions may exist in the cooling or radiating fins; those portions may disenable the cooling or radiating fins from withstanding stress caused by the operation of press-fitting the rectifying elements into the receiving or press-in holes and thus may cause the cooling or radiating fins to crack.

Moreover, to minimize the manufacturing cost of the cooling or radiating fins, it is desirable to manufacture those by aluminum die casting. However, in some cases, it may be difficult to manufacture the cooling or radiating fins by aluminum die casting without defects; consequently, it may become further difficult to prevent the manufactured cooling or radiating fins from cracking during the press-fit operation.

SUMMARY OF THE INVENTION

The present invention has been made in view of the above-mentioned problems.

It is, therefore, one object of the present invention to provide a rectifier for an automotive alternator, which has a heat sink with an improved structure that ensures high strength as well as excellent cooling performance of the heat sink.

It is another object of the present invention to provide an automotive alternator which incorporates therein such an improved rectifier.

According to one aspect of the present invention, there is provided a rectifier for an automotive alternator which includes: a plurality of rectifying elements configured to rectify an AC power generated by a stator of the automotive alternator to a DC power; and a heat sink having a plurality of fitting holes, in each of which one of the rectifying elements is fitted, and a major surface on which the fitting holes open, the heat sink also having a plurality of substantially annular ribs, each of which is formed on the major surface of the heat sink around a corresponding one of the fitting holes, each of the ribs having a first portion, which lies in an area on the major surface where a minimum distance between an inner edge of the heat sink defining the corresponding fitting hole and an outer edge of the heat sink defining an outline of the heat sink is smaller, and a second portion that lies in an area on the major surface where a minimum distance between the inner and outer edges is larger, the first portion having a greater protruding height from the major surface of the heat sink than the second portion.

With the above configuration, it is possible to uniformize the stress induced in the heat sink during the operation of press-fitting the rectifying elements into the fitting holes in the heat sink. Consequently, it becomes possible to reliably prevent the heat sink from cracking. Moreover, with the above configuration, the total surface area of the heat sink is increased, thereby enhancing the cooling capability of the heat sink. As a result, it becomes possible to ensure high strength as well as excellent cooling performance of the heat sink.

According to a further implementation of the invention, the rectifying elements are positive-side rectifying elements and the heat sink is a positive-side heat sink; the rectifier further includes a negative-side heat sink, which has the same structure as the positive-side heat sink, and a plurality of negative-side rectifying elements each of which is fitted in one of a plurality of fitting holes of the negative-side heat sink.

The positive-side and negative-side heat sinks are disposed such that the major surfaces of the positive-side and negative-side heat sinks are parallel to each other.

The rectifier further includes a terminal block which is interposed between the positive-side and negative-side heat sinks and includes therein electrical conductors for making electrical connection among the positive-side rectifying elements, the negative-side rectifying elements, and the stator.

The second portion of at least one of the ribs on the major surface of the heat sink has the protruding height from the major surface being equal to zero.

Each of the ribs on the major surface of the heat sink further has a connecting portion between the first and second portions, which has a surface inclined to axial end surfaces of the first and second portions; interfaces between the surface of the connecting portion and the axial end surface of the first portion and between the surface of the connecting portion and the axial end surface of the second portion are rounded.

According to another aspect of the present invention, there is provided an automotive alternator which includes: a rotor having a rotary shaft and working to create a rotating magnetic field; a stator working to generate an AC power in the rotating magnetic field created by the rotor; a frame supporting the rotor and the stator; and a rectifier including a plurality of rectifying elements and a heat sink, the rectifying elements being electrically connected to the stator to rectify the AC power generated by the stator to a DC power, the heat sink having a plurality of fitting holes, in each of which one of the rectifying elements is fitted, and a major surface on which the fitting holes open, the heat sink also having a plurality of substantially annular ribs, each of which is formed on the major surface of the heat sink around a corresponding one of the fitting holes, each of the ribs having a first portion, which lies in an area on the major surface where a minimum distance between an inner edge of the heat sink defining the corresponding fitting hole and an outer edge of the heat sink defining an outline of the heat sink is smaller, and a second portion that lies in an area on the major surface where a minimum distance between the inner and outer edges is larger, the first portion having a greater protruding height from the major surface of the heat sink than the second portion.

In a further implementation of the invention, the heat sink has formed therein at least one through-hole which opens on the major surface of the heat sink in a position closer to the second portion than the first portion of the closet one of the ribs to the through-hole. The automotive alternator further includes a cooling fan which is configured to rotate with rotation of the rotor to create a cooling air flow that passes through the at lease one through-hole of the heat sink.

The heat sink further has a plurality of fins each of which extends in a direction perpendicular to a normal direction of the major surface of the heat sink.

The fins are integrally formed with at least one of the first portions of the ribs of the heat sink.

The fins may be so formed as to protrude from the at least one of the first portions of the ribs in the normal direction of the major surface of the heat sink. Otherwise, the fins may be so formed as to protrude from the at least one of the first portions of the ribs in the direction perpendicular to the normal direction of the major surface of the heat sink.

BRIEF DESCRIPTION OF THE DRAWINGS

The present invention will be understood more fully from the detailed description given hereinafter and from the accompanying drawings of the preferred embodiments of the invention, which, however, should not be taken to limit the invention to the specific embodiments but are for the purpose of explanation and understanding only.

In the accompanying drawings.

DESCRIPTION OF THE PREFERRED EMBODIMENTS

Figure 1:
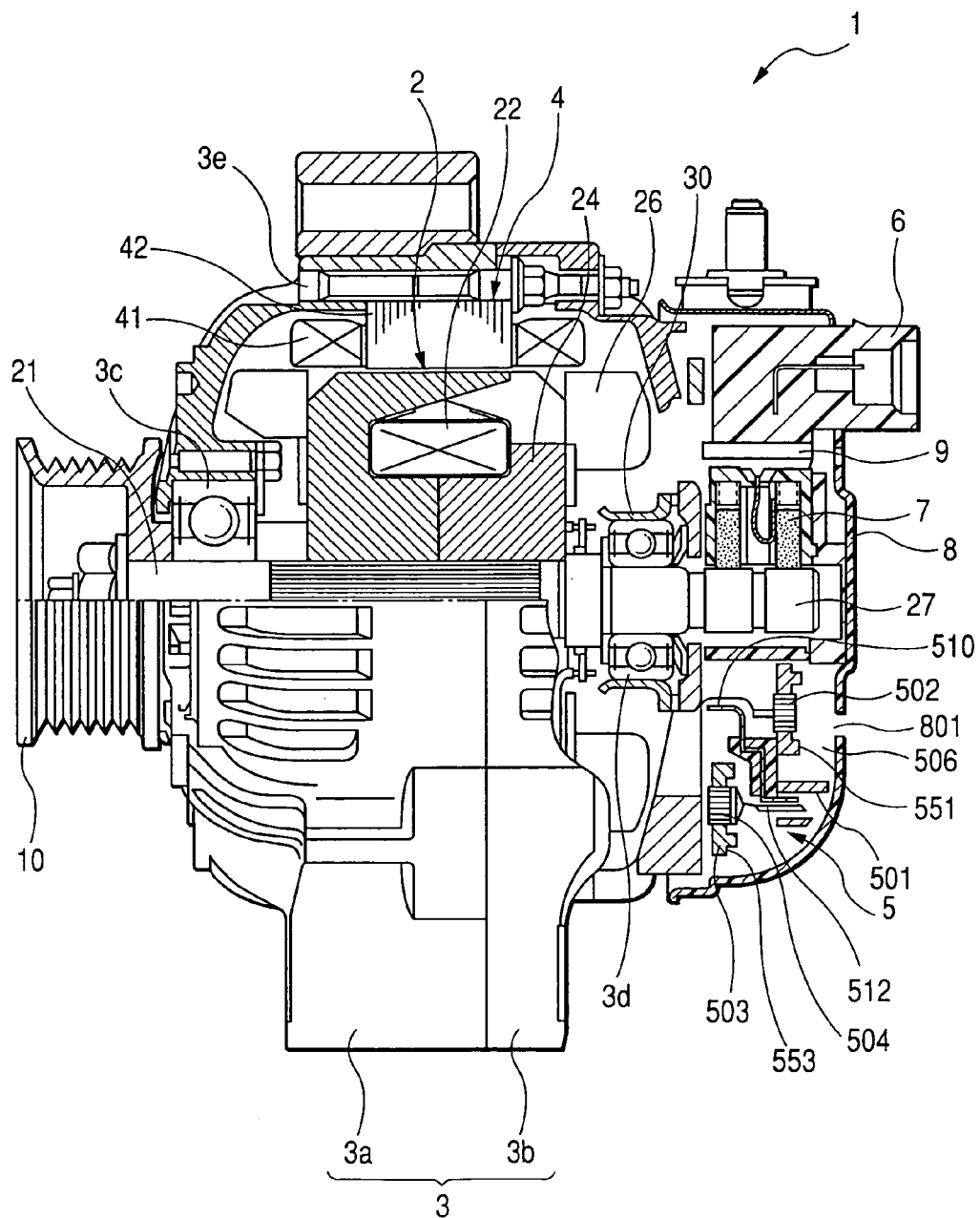
FIG. 1 is a partially cross-sectional view showing the overall configuration of an automotive alternator according to the first embodiment of the invention.

The preferred embodiments of the present invention will be described hereinafter with reference to FIGS. 1-11.

It should be noted that, for the sake of clarity and understanding, identical components having identical functions in different embodiments of the invention have been marked, where possible, with the same reference numerals in each of the figures.

FIG. 1 shows the overall configuration of an automotive alternator 1 according to the first embodiment of the invention.

As shown in FIG. 1, the automotive alternator 1 includes a rotor 2, a stator 4, a frame 3, a rectifier 5, brushes 7, a voltage regulator 9, a connector case 6, a protecting cover 8, and a pulley 10.

The rotor 2 includes a rotary shaft 21, a field winding 22, a pole core 24, and a cooling fan 26. The field winding 22 is so wound around the pole core 24 that when a filed current (or exciting current) is supplied to the field winding 22, the pole core 24 forms magnetic poles, in other words, a rotating magnetic field is created by the rotor 2. The cooling fan 26 is mounted to the rectifier-side (i.e., the right-side in FIG. 1) axial end of the pole core 24; it works to create a cooling air flow that passes through the rectifier 5.

The stator 4 is so configured as to surround the rotor 2. The stator 4 includes a three-phase stator winding 41 and a stator core 42. The stator winding 41 is so wound around the stator core 42 that the rotating magnetic field created by the rotor 2 passes through the stator core 42, thus inducing three-phase alternating current in the stator winding 41.

The frame 3 is composed of a front frame 3a and a rear frame 3b. The frame 3 supports the rotary shaft 21 of the rotor 2 via bearings 3c and 3d, which are respectively provided in the front and rear frames 3a and 3d. The frame 3 also supports the stator core 42 of the stator 4 by means of a plurality fixing bolts 3e.

The rectifier 5 is configured to full-wave rectify the three-phase AC power outputted from the stator winding 41 of the stator 4 to obtain a DC power. Details of the rectifier 5 will be described later.

The brushes 7 are in sliding contacts with slip rings 27 mounted on the rotary shaft 21, so that the filed current can be supplied from the brushes 7 to the field winding 22 via the slip rings 27.

The voltage regulator 9 is configured to regulate the DC voltage outputted from the rectifier 5 through manipulation of the field current supplied to the filed winding 22.

The connector case 6 holds therein terminals for inputting and outputting electric signals from and to a vehicle control device (not shown).

The protecting cover 8, which is made of a resin material, is so fixed to the rear frame 3b that it covers the rectifier 5, the voltage regulator 9, and the brushes 7, thereby protecting them from foreign matters.

The pulley 10 is mounted on the rotary shaft 21 to transmit a driving force from an engine to the automotive alternator 1 via a belt (not shown).

After having described the overall configuration of the automotive alternator 1, the rectifier 5 according to the present embodiment will be described in detail hereinafter.

Figure 2:
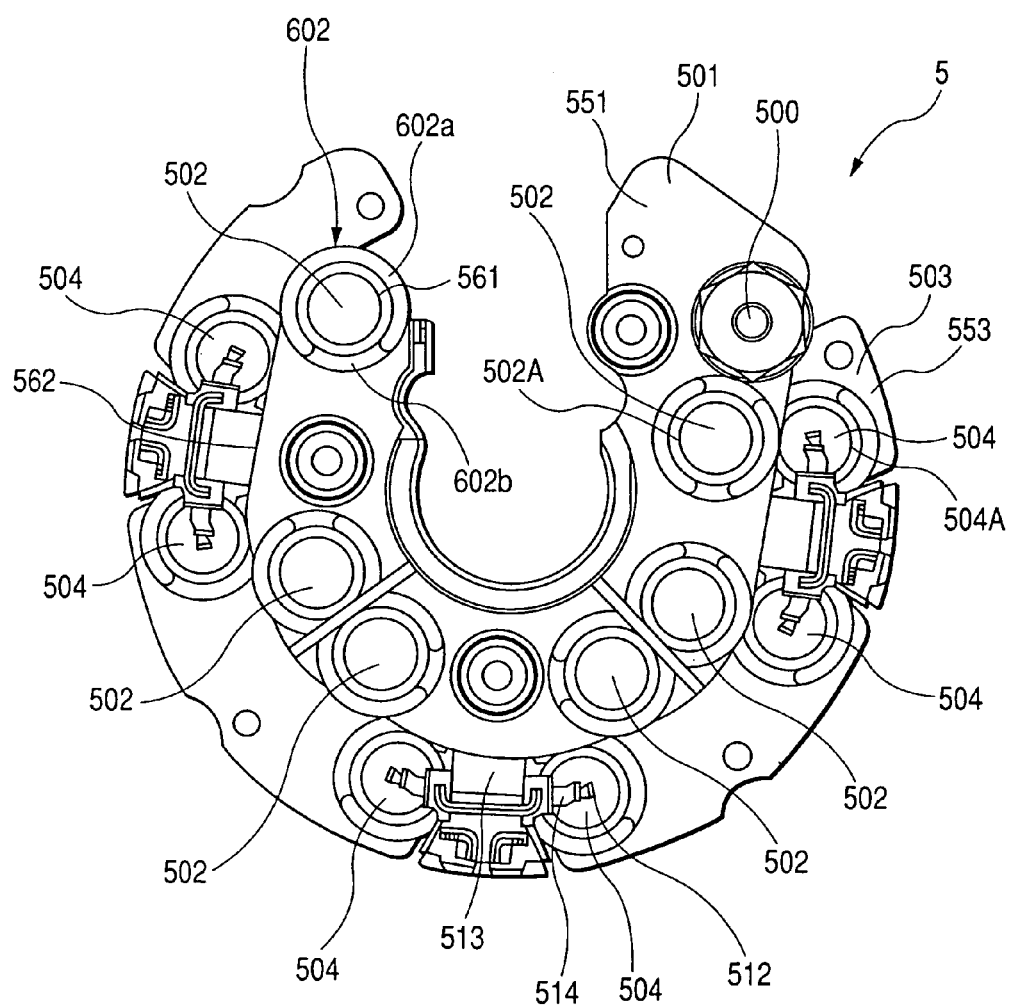
FIG. 2 is a plan view showing the overall configuration of a rectifier according to the first embodiment of the invention.
Figure 3:
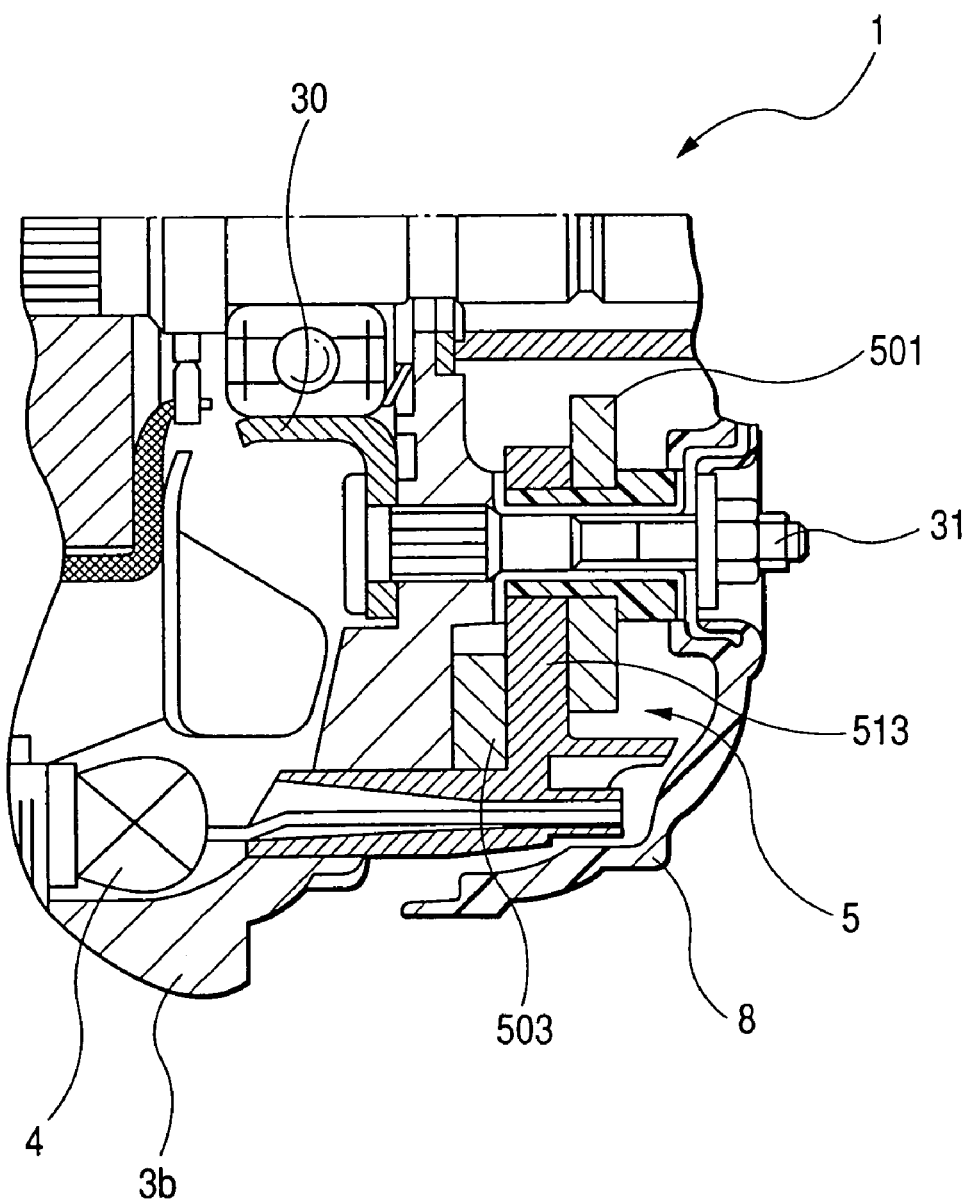
FIG. 3 is an enlarged partially cross-sectional view showing part of the automotive alternator including the rectifier according to the first embodiment of the invention.

Referring to FIGS. 1-3, the rectifier 5 includes a positive-side heat sink 501, a plurality of positive-side diodes 502 mounted to the positive-side heat sink 501, a negative-side heat sink 503, a plurality of negative-side diodes 504 mounted to the negative-side heat sink 503, and a terminal block 513 interposed between the positive-side and negative-side heat sinks 501 and 503.

The positive-side and negative-side heat sinks 501 and 503 are apart from each other in the axial direction of the rotor 2 (i.e., the axial direction of the rotary shaft 21) and disposed around the rotary shaft 21 such that they overlap each other in the axial direction of the rotor 2.

The terminal block 513 is made of a resin material and electrically insulates the positive-side and negative-side heat sinks 501 and 503 from each other. The terminal block 513 has electrical conductors 514 insert-molded therein. The electrical conductors 514 electrically connect the three-phase stator winding 41 of the stator 4 to the positive-side diodes 502 and the negative-side diodes 504.

The positive-side diodes 502 and the negative-side diodes 504 work, as rectifying elements, to full-wave rectify the three-phase AC power outputted from the stator winding 41. Each of the positive-side diodes 502 is press-fitted in one of a plurality of fitting holes 502A formed in the positive-side heat sink 501 and has a lead 510 extending therefrom toward the negative-side heat sink 503. On the contrary, each of the negative-side diodes 504 is press-fitted in one of a plurality of fitting holes 504A formed in the negative-side heat sink 503 and has a lead 512 extending therefrom toward the positive-side heat sink 501.

The leads 510 extending from the positive-side diodes 502 and the leads 512 extending from the negative-side diodes 504 are connected to the electrical conductors 514 in the terminal block 513, thereby forming at least one set of three-phase full-wave rectification circuit. In the present embodiment, a total of six positive-side diodes 502 and a total of six negative-side diodes 504 are employed, as seen from FIG. 2, to form two sets of three-phase full-wave rectification circuit. The DC power obtained by the full-wave rectification is taken out from a blot 500 that is attached to the positive-side heat sink 501 to serve as an output terminal of the rectifier 5.

The rectifier 5 having the above-described structure is interposed between the rear frame 3b and the protecting cover 8 and fixed therebetween by means of a plurality of fixing bolts 31. The fixing bolts 31 also serve as supporting members for supporting a rear bearing box 30. Further, in the present embodiment, the negative-side heat sink 503 has a greater outer diameter than the positive-side heat sink 504, and the negative-side diodes 504 are accordingly located radially outside of the positive-side diodes 502. In addition, as seen from FIG. 3, the negative-side heat sink 503 abuts the rear frame 3b in the vicinities of the fixing bolts 31.

In the present embodiment, both the positive-side and negative-side heat sinks 501 and 503 are made by aluminum die casting, so as to reduce the manufacturing cost thereof through improvement in volume efficiency.

Figure 4:
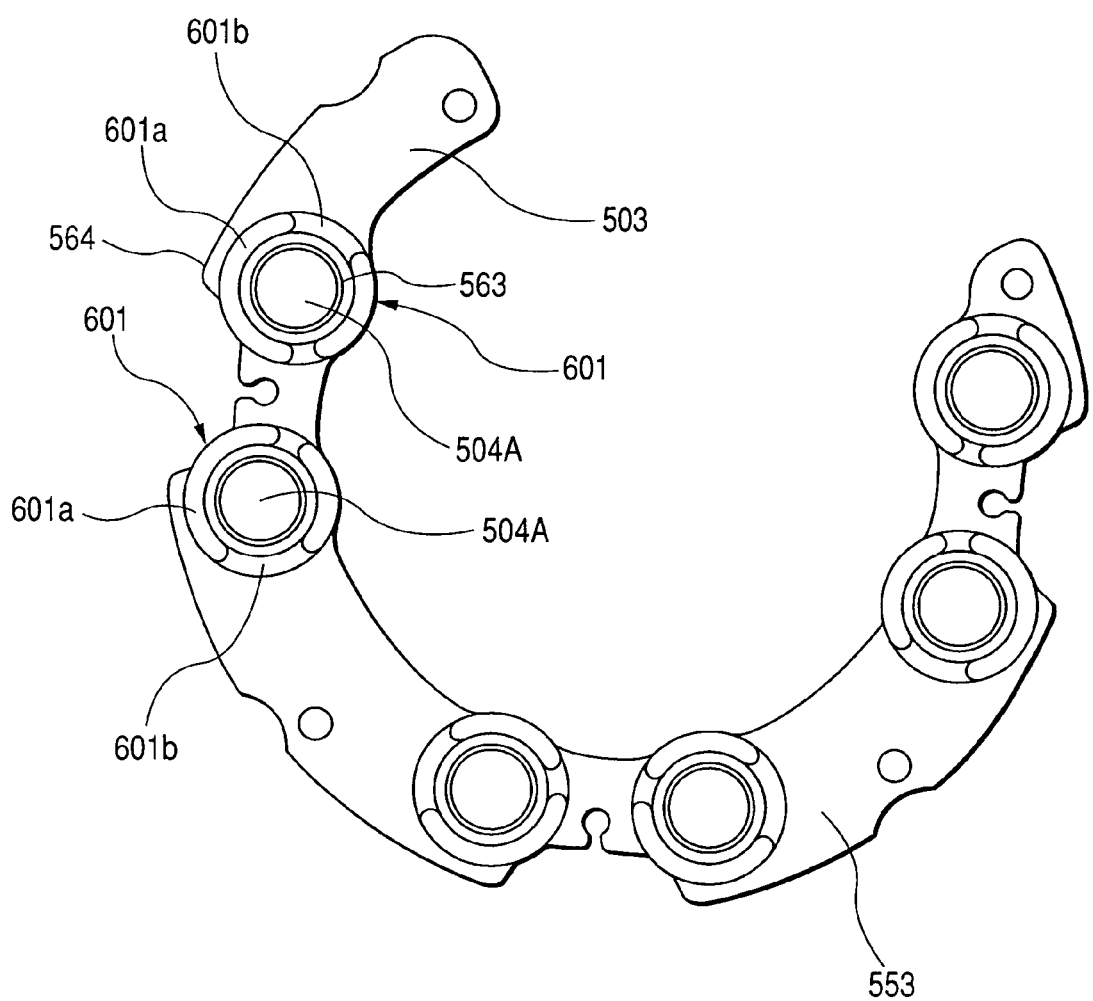
FIG. 4 is a plan view showing a negative-side heat sink of the rectifier according to the first embodiment of the invention.

Referring now to FIG. 4, the negative-side heat sink 503 has a plurality of annular ribs 601 formed on a major surface 553 thereof that faces the protecting cover 8.

Specifically, each of the ribs 601 is formed around a corresponding one of the fitting holes 504A that open on the major surface 553. Each of the ribs 601 includes a plurality of portions having different protruding heights from the major surface 553; the protruding heights of the portions are in inverse proportion to the radial thicknesses of the negative-side heat sink 503 in the respective areas where the portions lie. Here, the radial thickness of the negative-side heat sink 503 in an area on the major surface 553 is defined by the minimum distance between an inner edge 563 of the negative-side heat sink 503 defining the corresponding fitting hole 504A and an outer edge 564 of the negative-side heat sink 503 defining the outline of the negative-side heat sink 503 in that area on the major surface 553.

For example, each of the ribs 601 has a first portion 601a and a second portion 601b. The first portion 601a lies in an area on the major surface 553 where the radial thickness of the negative-side heat sink 503 is smaller, while the second portion 601b lies in an area on the major surface 553 where the radial thickness of the negative-side heat sink 503 is larger. Accordingly, the first portion 601a has a greater protruding height from the major surface 553 than the second portion 601b.

It is preferable that the protruding heights of the portions of each of the ribs 601 are set such that the geometrical moment of inertia I of the negative-side heat sink 503 is uniform along the circumferential direction of the corresponding fitting hole 504A. The geometrical moment of inertia I on a cross section of the negative-side heat sink 503 parallel to the axial direction of the rotor 2 can be determined by the following equation:

$$I = 1/12 \times B \times H^3$$

where B is a radial width of the cross section and H is an axial height of the same.

Similarly, referring back to FIG. 2, the positive-side heat sink 501 has a plurality of annular ribs 602 formed on a major surface 551 thereof that faces the protecting cover 8.

Specifically, each of the ribs 602 is formed around a corresponding one of the fitting holes 502A that open on the major surface 551. Each of the ribs 602 includes a plurality of portions having different protruding heights from the major surface 551; the protruding heights of the portions are in inverse proportion to the radial thicknesses of the positive-side heat sink 501 in the respective areas where the portions lie.

For example, each of the ribs 602 has a first portion 602a and a second portion 602b. The first portion 602a lies in an area on the major surface 551 where the radial thickness of the positive-side heat sink 501 is smaller, while the second portion 602b lies in an area on the major surface 551 where the radial thickness of the positive-side heat sink 501 is larger. Accordingly, the first portion 602a has a greater protruding height from the major surface 551 than the second portion 602b.

It is also preferable that the protruding heights of the portions of each of the ribs 602 are set such that the geometrical moment of inertia I of the positive-side heat sink 501 is uniform along the circumferential direction of the corresponding fitting hole 502A.

With the above-described configuration of the annular ribs 601 and 602, it is possible to uniformize the stresses induced in the negative-side and positive-side heat sinks 503 and 501 during the operation of press-fitting the negative-side diodes 504 and the positive-side diodes 502 respectively into the fitting holes 504A in the negative-side heat sink 503 and the fitting holes 502A in the positive-side heat sink 501.

Consequently, it becomes possible to avoid any concentration of stress on the small-radial-thickness portions of the negative-side and positive-side heat sinks 503 and 501, thereby reliably preventing the heat sinks 503 and 501 from cracking.

Moreover, with the above-described configuration, the total surface areas of the negative-side and positive-side heat sinks 503 and 501 are increased, thereby enhancing the cooling capability of the heat sinks 503 and 501.

As a result, it becomes possible to ensure high strength as well as excellent cooling performance of the negative-side and positive-side heat sinks 503 and 501.

Figure 5:
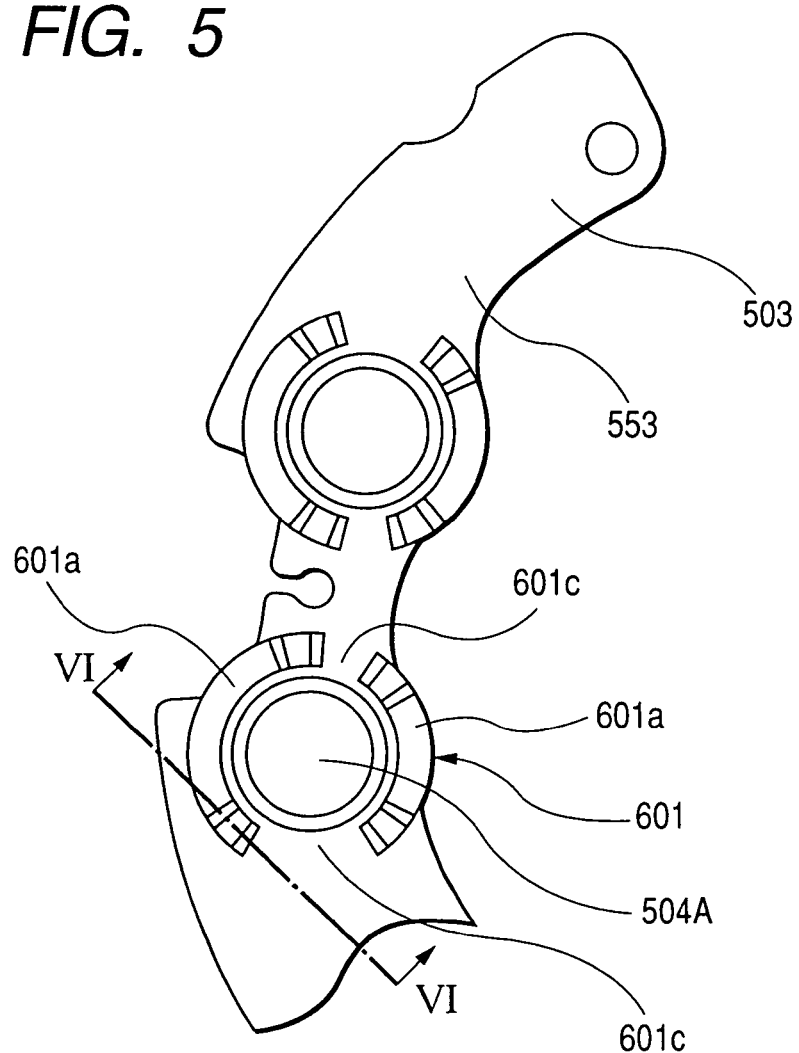
FIG. 5 is a plan view showing part of a negative-side heat sink of a rectifier according to the second embodiment of the invention.

FIG. 5 shows part of a negative-side heat sink 503 of a rectifier 5 according to the second embodiment of the invention.

In this embodiment, as shown in FIG. 5, each of ribs 601 formed on a major surface 553 of the negative-side heat sink 503 has a first portion 601a and a second portion 601c. The first portion 601a lies in an area on the major surface 553 where the radial thickness of the negative-side heat sink 503 is smaller, while the second portion 601c lies in an area on the major surface 553 where the radial thickness of the negative-side heat sink 503 is larger. The first portion 601a has a large protruding height from the major surface 553, while the second portion 601c has a protruding height from the major surface 553 being equal to zero. In other words, each of the ribs 601 has the shape of an incomplete ring.

Figure 6:
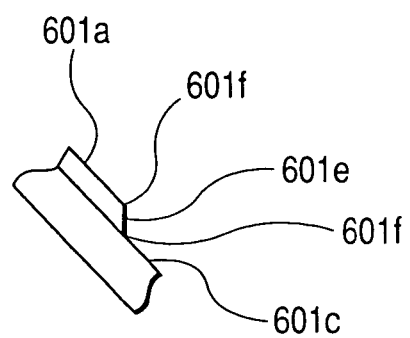
FIG. 6 is a cross-sectional view taken along the line VI-VI in FIG. 5.

Moreover, referring further to FIG. 6, each of the ribs 601 has a connecting portion 601e between the first and second portions 601a and 601c. The connecting portion 601e has a surface that is inclined to axial end surfaces of the first and second portions 601a and 601c. Further, interfaces 601f between the surface of the connecting portion 601e and the axial end surface of the first portion 601a and between the surface of the connecting portion 601e and the axial end surface of the second portion 601c are rounded.

Furthermore, in this embodiment, a positive-side heat sink 501 of the rectifier 5 also has a plurality of ribs 602 that are formed in the same manner as the ribs 601 of the negative-side heat sink 503 described above.

The formation of the ribs 601 and 602 according to the second embodiment is particularly useful in cases where it is impossible for the ribs 601 or 602 to have large protruding heights in areas where the radial thickness of the negative-side heat sink 503 or the positive-side heat sink 501 is small, due to dimensional constraints. More specifically, in such cases, it is still possible to secure sufficiently high strength of the negative-side heat sink 503 or the positive-side heat sink 501 by setting the protruding heights of the ribs 601 or 602 to zero instead in areas where the radial thickness of the negative-side heat sink 503 or the positive-side heat sink 501 is large.

Moreover, through providing the inclined connecting portions (e.g., 601e) and the rounded interfaces (e.g., 601f), it is possible to avoid any concentration of stress on the interfaces between different portions of the ribs 601 and 602, thereby further reliably securing high strength of the heat sinks 503 and 501.

Figure 7:
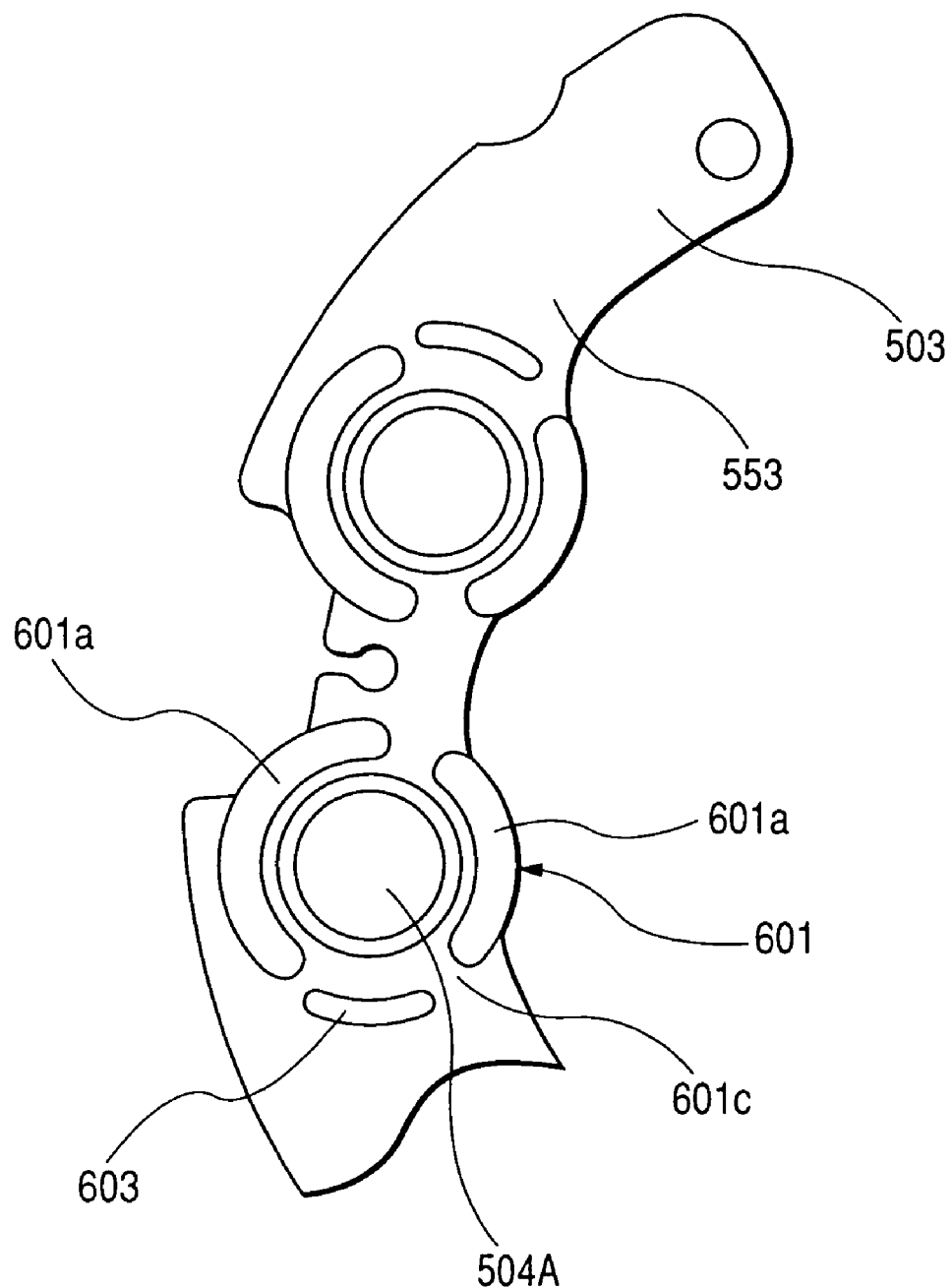
FIG. 7 is a plan view showing part of a negative-side heat sink of a rectifier according to the third embodiment of the invention.

FIG. 7 shows part of a negative-side heat sink 503 of a rectifier 5 according to the third embodiment of the invention.

In this embodiment, each of the ribs 601 has, as in the second embodiment, both a first portion 601a whose protruding height is large and a second portion 601c whose protruding height is zero. Moreover, in this embodiment, the negative-side heat sink 503 further has a plurality of through-holes 603, each of which is formed in the vicinity of the second portion 601c of a corresponding one of the ribs 601 and has the shape of a curved band.

Furthermore, in this embodiment, a positive-side heat sink 501 of the rectifier 5 also has a plurality of through-holes 603 that are formed in the same manner as those of the negative-side heat sink 503 described above.

Through providing the through-holes 603 in the areas where the radial thickness of the negative-side heat sink 503 or the positive-side heat sink 501 is large, it is possible to further effectively uniformize stresses induced in the heat sinks 503 and 501, thereby further reliably securing sufficiently high strength of the heat sinks 503 and 501.

Moreover, through providing the through-holes 603, the total surface areas of the negative-side and positive-side heat sinks 503 and 501 are further increased, thereby enhancing the cooling capability of the heat sinks 503 and 501.

Furthermore, during operation of the automotive alternator 1, the cooling air flow created by the cooling fan 26 will pass through the through-holes 603, thus further improving the cooling performance of the negative-side and positive-side heat sinks 503 and 501.

Figure 8:
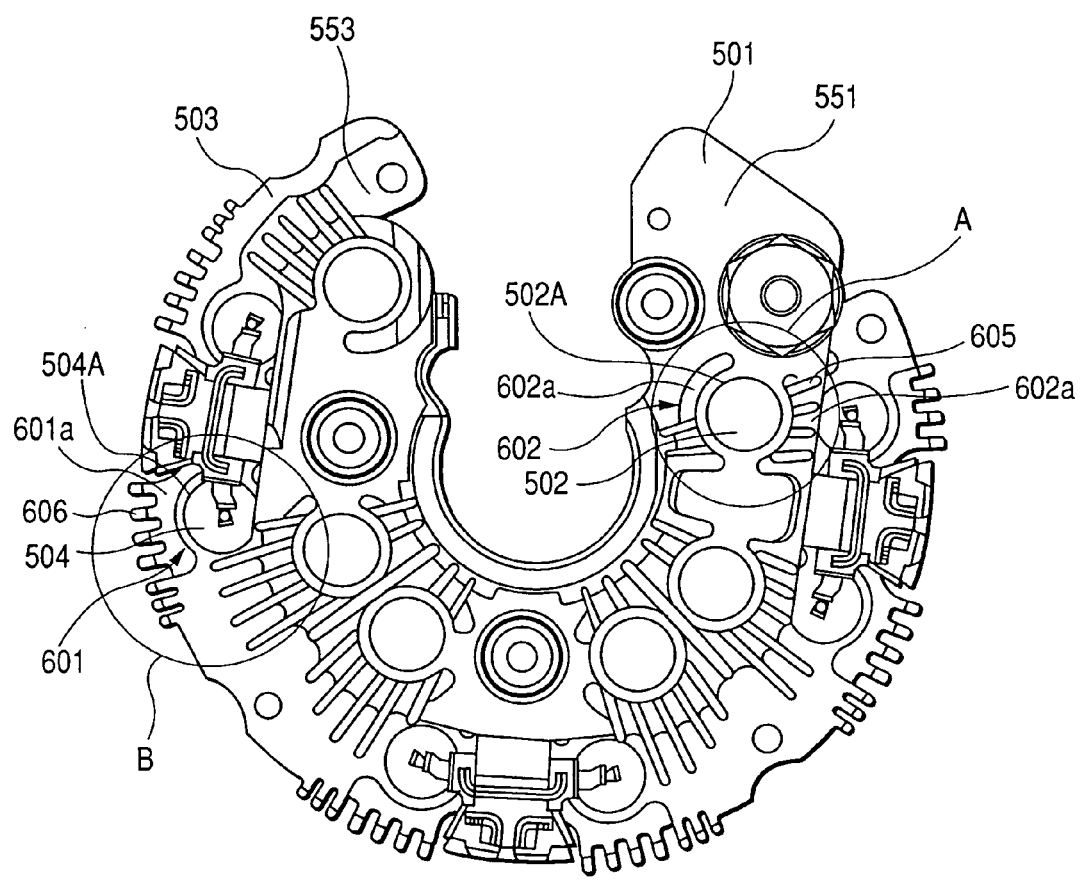
FIG. 8 is a plan view showing the overall configuration of a rectifier according to the fourth embodiment of the invention.
Figure 9:
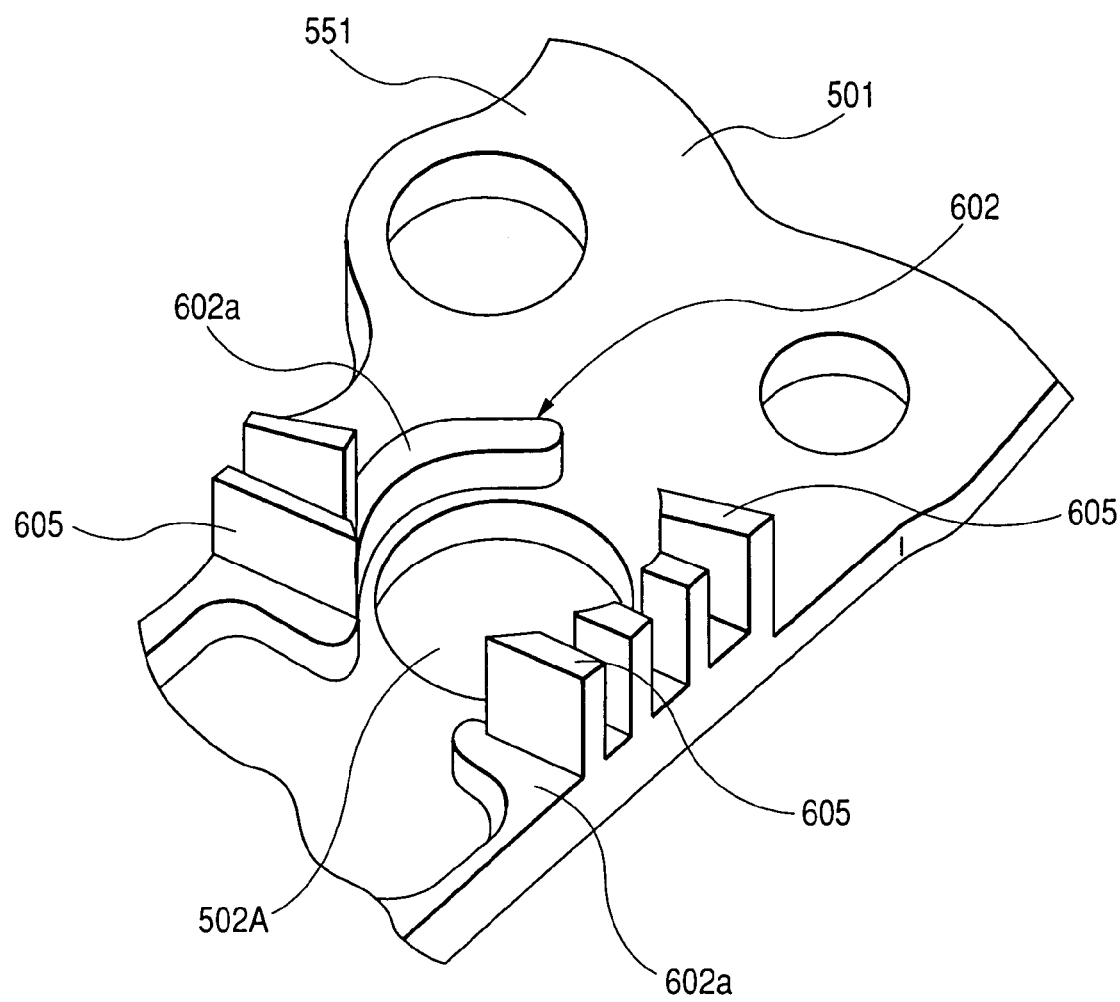
FIG. 9 is a perspective view showing part of a positive-side heat sink of the rectifier according to the fourth embodiment of the invention.
Figure 10:
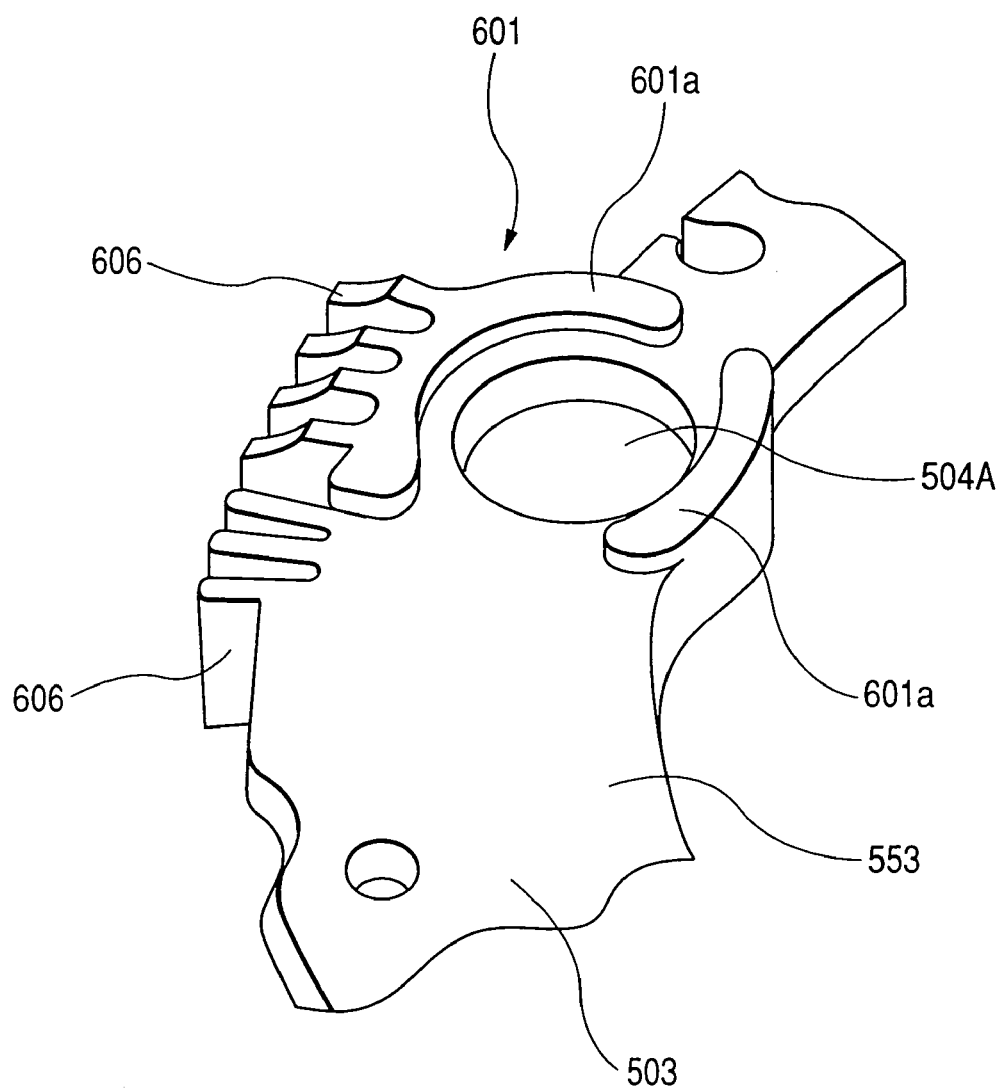
FIG. 10 is a perspective view showing part of a negative-side heat sink of the rectifier according to the fourth embodiment of the invention.
Figure 11:
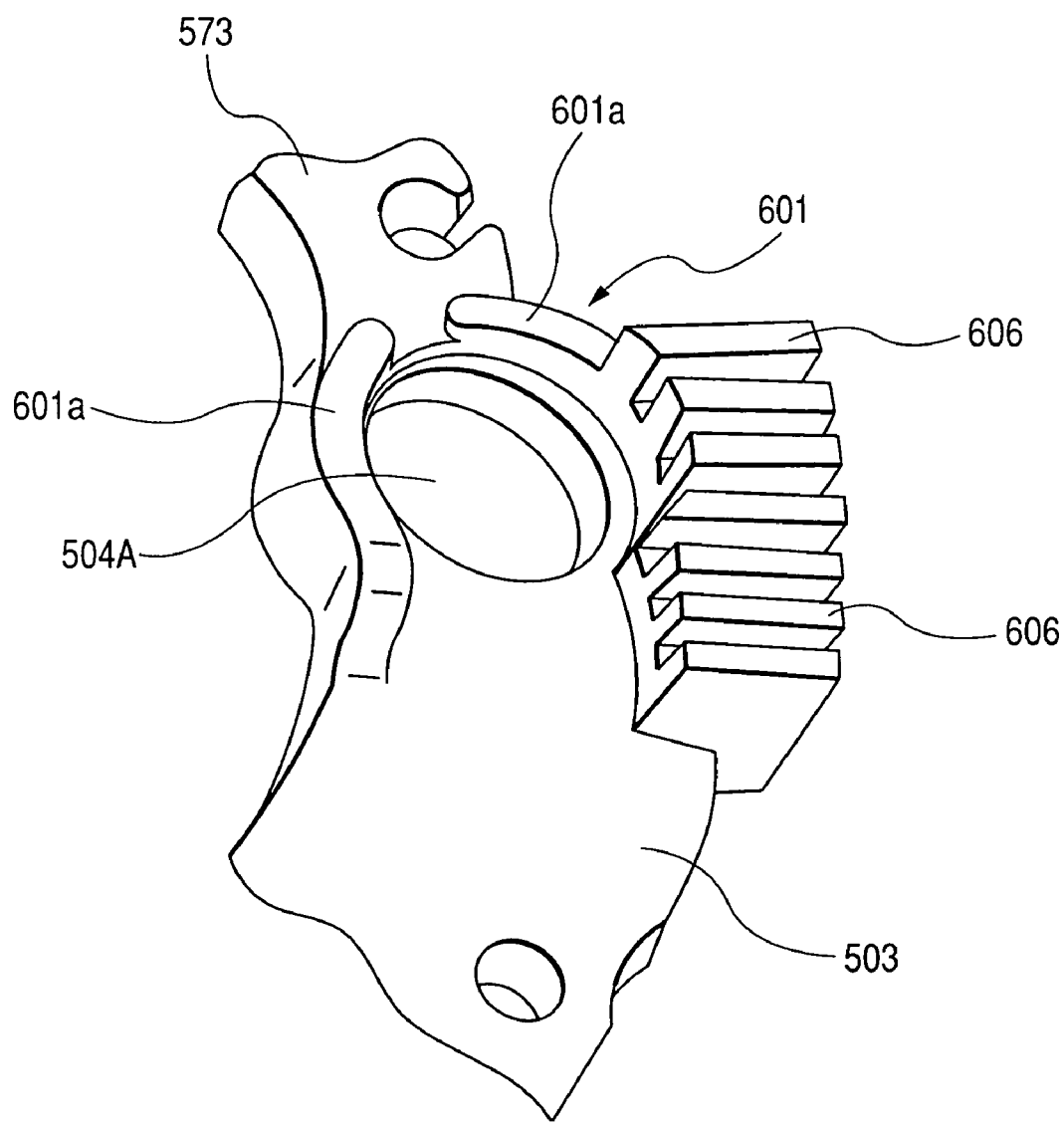
FIG. 11 is a perspective view showing the part of the negative-side heat sink of the rectifier according to the fourth embodiment of the invention in the opposite direction to FIG. 10.

FIG. 8 shows a rectifier 5 according to the fourth embodiment of the invention. FIG. 9 shows part of a positive-side heat sink 501 of the rectifier 5 according to the fourth embodiment. FIG. 10 shows part of a negative-side heat sink 503 of the rectifier 5 according to the fourth embodiment. FIG. 11 shows the part of the negative-side heat 503 in the opposite direction to FIG. 10.

As shown in FIGS. 8 and 9, the positive-side heat sink 501 has a plurality of fins 605 formed in the vicinity of each of the fitting holes 502A.

Specifically, each of the fins 605 extends in the radial direction of the rotor 2 (i.e., in a direction perpendicular to the normal direction of a major surface 551 of the heat sink 501). Further, each of the fins 605 is integrally formed with one of large-protruding-height portions 602a of a corresponding rib 602 on the major surface 551, so as to protrude from the large-protruding-height portion 602 in the axial direction of the rotor 2 (i.e., in the normal direction of the major surface 551).

Similarly, as shown in FIGS. 8 and 10, the negative-side heat sink 503 has a plurality of fins 606 formed in the vicinity of each of the fitting holes 504A.

Specifically, each of the fins 606 extends in the radial direction of the rotor 2 (i.e., in a direction perpendicular to the normal direction of a major surface 553 of the heat sink 503). Further, part of the fins 606 are integrally formed with one of large-protruding-height portions 601a of a corresponding rib 601 on the major surface 553, so as to protrude from the large-protruding-height portion 601a in the radial direction of the rotor 2.

Moreover, as shown in FIG. 11, the negative-side heat sink 503 further has a plurality of ribs 601 formed on a major surface 573 thereof which is opposite to the major surface 553 and thus faces the rear frame 3b. Further, part of the fins 606 are integrally formed with one of large-protruding-height portions 601a of the ribs 601 on the major surface 573, so as to protrude from the large-protruding-height portion 601a in the axial direction of the rotor 2 (i.e., in the normal direction of the major surface 573).

Through providing the fins 606 and 605, the total surface areas of the negative-side and positive-side heat sinks 503 and 501 are further increased, thereby further enhancing the cooling capability of the heat sinks 503 and 501.

Moreover, since the fins 606 and 605 are integrally formed with the large-protruding-height portions 601a of the ribs 601 or the large-protruding-height portions 602a of the ribs 602, it is possible to secure sufficiently high strength of the fins 606 and 605 even with the complicated shapes of the fins 606 and 605.

Consequently, it becomes possible to further enhance the cooling capability of the negative-side and positive-side heat sinks 503 and 501 while securing sufficiently high strength of the heat sinks 503 and 501.

While the above particular embodiments of the invention have been shown and described, it will be understood by those who practice the invention and those skilled in the art that various modifications, changes, and improvements may be made to the invention without departing from the spirit of the disclosed concept.

For example, in the third embodiment of the invention, there is provided only one through-hole 603 with the curved-band shape in the vicinity of each of the second portions 601c of the ribs 601 on the negative-side heat sink 503 and the second portions 602c of the ribs 602 on the positive-side heat sink 501.

However, it is also possible to provide other numbers of through-holes 603 with other shapes in the vicinity of each of the second portions 601c of the ribs 601 on the negative-side heat sink 503 and the second portions 602c of the ribs 602 on the positive-side heat sink 501.

Further, in the previous embodiments of the invention, both the positive-side and negative-side heat sinks 501 and 503 are made by aluminum die casting. However, the heat sinks 501 and 503 may also be made by machining metal materials having high heat conductivity, such as aluminum and copper.

Moreover, in the previous embodiments of the invention, there are provided the ribs 601 on the negative-side heat sink 503 and the ribs 602 on the positive-side heat sink 501. However, it is also possible to provide only the ribs 601 on the negative-side heat sink 503 or only the ribs 602 on the positive-side heat sink 501.

Furthermore, in the previous embodiments of the invention, all of the fitting holes 504A and 502A are each provided with one of the ribs 601 or one of the ribs 602 formed in the vicinity thereof. However, it is also possible that only part of the fitting holes 504A and 502A are each provided with one of the ribs 601 or one of the ribs 602 formed in the vicinity thereof.

Such modifications, changes, and improvements are possible within the scope of the appended claims.

What is claimed is:

1. An automotive alternator comprising:
    a rotor having a rotary shaft and working to create a rotating magnetic field;
    a stator working to generate an AC power in the rotating magnetic field created by the rotor;
    a frame supporting the rotor and the stator; and
    a rectifier including:
        a plurality of rectifying elements that are electrically connected to the stator to rectify the AC power generated by the stator to a DC power, and
        a heat sink including:
            a plurality of fitting holes, wherein one of the rectifying elements is fitted in each of the plurality of fitting holes,
            a major surface on which the fitting holes open, and
            a plurality of substantially annular ribs, wherein each of the ribs is formed on the major surface of the heat sink around a corresponding one of the plurality of fitting holes, each of the ribs including:
                a first portion, and
                a second portion, wherein:
        the first portion lies in an area on the major surface where a minimum distance between an inner edge of the heat sink defining the corresponding one of the plurality of fitting holes and an outer edge of the heat sink defining an outline of the heat sink is smaller,
        the second portion lies in an area on the major surface where a minimum distance between the inner and outer edges is larger, and
        the first portion having a greater protruding height from the major surface of the heat sink than the second portion so as to enhance a strength of the heat sink.

2. The automotive alternator as set forth in claim 1, wherein:
    the rectifying elements are positive-side rectifying elements and the heat sink is a positive-side heat sink, and
    the rectifier further includes:
        a negative-side heat sink, which has the same structure as the positive-side heat sink, and
        a plurality of negative-side rectifying elements, wherein each of the plurality of negative-side rectifying elements is fitted in one of a plurality of fitting holes of the negative-side heat sink.

3. The automotive alternator as set forth in claim 2, wherein the positive-side and negative-side heat sinks of the rectifier are disposed such that the major surfaces of the positive-side and negative-side heat sinks are perpendicular to the rotary shaft of the rotor.

4. The automotive alternator as set forth in claim 3, wherein the rectifier further includes a terminal block that is interposed between the positive-side and negative-side heat sinks and the terminal block includes therein electrical conductors for making electrical connection among the positive-side rectifying elements, the negative-side rectifying elements, and the stator.

5. The automotive alternator as set forth in claim 4, further comprising a cooling fan which is configured to rotate with rotation of the rotor to create a cooling air flow that passes through the rectifier.

6. The automotive alternator as set forth in claim 1, wherein the second portion of at least one of the ribs on the major surface of the heat sink has the protruding height from the major surface being equal to zero.

7. The automotive alternator as set forth in claim 1, wherein:
    the each of the ribs on the major surface of the heat sink further includes a connecting portion between the first and second portions and the connecting portion has a surface inclined to axial end surfaces of the first and second portions, and interfaces between the surface of the connecting portion and the axial end surface of the first portion and between the surface of the connecting portion and the axial end surface of the second portion are rounded.

8. The automotive alternator as set forth in claim 1, wherein the heat sink has formed therein at least one through-hole that opens on the major surface of the heat sink in a position closer to the second portion than the first portion of a closest one of the ribs to the through-hole.

9. The automotive alternator as set forth in claim 8, further comprising a cooling fan which is configured to rotate with rotation of the rotor to create a cooling air flow that passes through the at least one through-hole of the heat sink.

10. The automotive alternator as set forth in claim 1, wherein the heat sink further has a plurality of fins each of which extends in a direction perpendicular to a normal direction of the major surface of the heat sink.

11. The automotive alternator as set forth in claim 10, wherein the fins are integrally formed with at least one of the first portions of the ribs of the heat sink.

12. The automotive alternator as set forth in claim 11, wherein the fins are formed so as to protrude from the at least one of the first portions of the ribs in a normal direction of the major surface of the heat sink.

13. The automotive alternator as set forth in claim 11, wherein the fins are so formed as to protrude from the at least one of the first portions of the ribs in a direction perpendicular to the normal direction of the major surface of the heat sink.

14. A rectifier for an automotive alternator, comprising:
a plurality of rectifying elements configured to rectify AC power generated by a stator of the automotive alternator to DC power; and
a heat sink including:
a plurality of fitting holes, wherein one of the rectifying elements is fitted in each of the plurality of fitting holes,
a major surface on which the plurality of fitting holes open, and
a plurality of substantially annular ribs, wherein each of the plurality of substantially annular ribs is formed on the major surface of the heat sink around a corresponding one of the fitting holes, each of the ribs including:
a first portion, and
a second portion, wherein:
the first portion lies in an area on the major surface where a minimum distance, between an inner edge of the heat sink defining the corresponding fitting hole and an outer edge of the heat sink defining an outline of the heat sink is smaller, and the second portion lies in an area on the major surface where a minimum distance between the inner and outer edges is larger, and
the first portion has a greater protruding height from the major surface of the heat sink than the second portion so as to enhance a strength of the heat sink.

15. The rectifier as set forth in claim 14, wherein:
the rectifying elements are positive-side rectifying elements and the heat sink is a positive-side heat sink, and
the rectifier further includes:
a negative-side heat sink that has the same structure as the positive-side heat sink, and
a plurality of negative-side rectifying elements, wherein each of the plurality of negative-side rectifying elements is fitted in one of a plurality of fitting holes of the negative-side heat sink.

16. The rectifier as set forth in claim 15, wherein the positive-side and negative-side heat sinks are disposed such that major surfaces of the positive-side and negative-side heat sinks are parallel to each other.

17. The rectifier as set forth in claim 16, further comprising a terminal block that is interposed between the positive-side and negative-side heat sinks and the terminal block includes therein electrical conductors for making electrical connection among the positive-side rectifying elements, the negative-side rectifying elements, and the stator.

18. The rectifier as set forth in claim 14, wherein the second portion of at least one of the ribs on the major surface of the heat sink has the protruding height from the major surface being equal to zero.

19. The rectifier as set forth in claim 14, wherein:
the each of the ribs on the major surface of the heat sink further has a connecting portion between the first and second portions and the connecting portion has a surface inclined to axial end surfaces of the first and second portions, and
interfaces between the surface of the connecting portion and the axial end surface of the first portion and between the surface of the connecting portion and the axial end surface of the second portion are rounded.

20. The rectifier as set forth in claim 14, wherein the heat sink has at least one through-hole which opens on the major surface of the heat sink in a position closer to the second portion than the first portion of the closest one of the ribs to the through-hole.

\* \* \* \* \*